United States Patent
Hung

(10) Patent No.: US 12,188,661 B2
(45) Date of Patent: Jan. 7, 2025

(54) TEMPERATURE ADJUSTMENT APPARATUS FOR HIGH TEMPERATURE OVEN

(71) Applicant: Yi-Ming Hung, Miaoli County (TW)

(72) Inventor: Yi-Ming Hung, Miaoli County (TW)

( * ) Notice: Subject to any disclaimer, the term of this patent is extended or adjusted under 35 U.S.C. 154(b) by 169 days.

(21) Appl. No.: 18/060,561

(22) Filed: Nov. 30, 2022

(65) Prior Publication Data

US 2023/0090651 A1 Mar. 23, 2023

Related U.S. Application Data

(62) Division of application No. 16/666,359, filed on Oct. 28, 2019, now Pat. No. 11,703,229.

(30) Foreign Application Priority Data

Dec. 5, 2018 (TW) .................................. 107144028
Jun. 5, 2019 (TW) .................................. 108119887

(51) Int. Cl.
*H01L 21/67* (2006.01)
*F24C 15/00* (2006.01)

(52) U.S. Cl.
CPC ...... *F24C 15/006* (2013.01); *H01L 21/67017* (2013.01); *H01L 21/67109* (2013.01)

(58) Field of Classification Search
CPC ................................................ H01L 21/67109
See application file for complete search history.

(56) References Cited

U.S. PATENT DOCUMENTS

| | | | | |
|---|---|---|---|---|
| 5,249,960 A * | 10/1993 | Monoe | ..................... | F27D 15/02 432/83 |
| 5,307,568 A * | 5/1994 | Matsuo | ............. | H01J 37/32871 34/92 |
| 5,556,275 A * | 9/1996 | Sakata | .................... | C23C 16/54 432/5 |
| 6,491,518 B1 * | 12/2002 | Fujikawa | .......... | H01L 21/67109 118/728 |
| 6,867,147 B2 * | 3/2005 | Takagi | ............. | H01L 21/67017 438/719 |
| 11,232,963 B2 * | 1/2022 | Oosterlaken | ...... | H01L 21/67103 |
| 2011/0210117 A1 * | 9/2011 | Yonenaga | .............. | H05B 6/105 219/634 |
| 2012/0015525 A1 * | 1/2012 | Endo | ................. | H01L 21/67109 438/758 |

(Continued)

*Primary Examiner* — Jarrett J Stark

(57) ABSTRACT

A temperature adjustment apparatus for a high temperature oven, comprising: an oven comprising an oven cavity, at least one intake manifold, at least one exhaust manifold, an inner casing cover, at least one heating element, and a chamber door; wherein a processing chamber is formed inside the oven cavity; the inner casing cover is disposed around an inner wall of the oven cavity; the inner casing cover is heated by at least one of the heating elements, and the processing chamber is heated by the inner casing cover in the form of thermal radiation; and a gas reprocessing device comprising a gas recovery device, wherein a gas in the processing chamber is sucked into the gas reprocessing device by using the gas recovery device, and the sucked gas can be directly discharged from the gas reprocessing device or reprocessed and flows back to the processing chamber.

9 Claims, 4 Drawing Sheets

(56) References Cited

U.S. PATENT DOCUMENTS

| | | | | |
|---|---|---|---|---|
| 2014/0170320 | A1* | 6/2014 | Yamamoto | C23C 16/402 118/695 |
| 2014/0213069 | A1* | 7/2014 | Takebayashi | C23C 16/45561 438/770 |
| 2015/0107517 | A1* | 4/2015 | Hasebe | C23C 16/452 118/723 R |
| 2015/0370245 | A1* | 12/2015 | Sugishita | C23C 16/52 700/121 |
| 2016/0035600 | A1* | 2/2016 | Rivera | B01D 53/02 96/111 |
| 2017/0183770 | A1* | 6/2017 | Komae | C23C 16/45557 |
| 2017/0218507 | A1* | 8/2017 | Kim | C23C 16/46 |
| 2018/0135176 | A1* | 5/2018 | Morikawa | C23C 16/45563 |
| 2018/0187307 | A1* | 7/2018 | Yoshida | C23C 16/345 |
| 2018/0286662 | A1* | 10/2018 | Nagatomi | C23C 16/405 |
| 2018/0304286 | A1* | 10/2018 | Ishii | B05B 7/066 |
| 2018/0312969 | A1* | 11/2018 | Ishii | C23C 16/4401 |
| 2019/0106787 | A1* | 4/2019 | Ohno | C23C 16/45563 |
| 2019/0287830 | A1* | 9/2019 | Saido | C23C 16/345 |
| 2019/0333789 | A1* | 10/2019 | Inoue | H01L 21/6719 |
| 2019/0341281 | A1* | 11/2019 | Yamaguchi | H01L 21/67017 |
| 2019/0360098 | A1* | 11/2019 | Shimada | H01L 21/02263 |
| 2020/0066551 | A1* | 2/2020 | Okajima | H01L 21/67236 |
| 2020/0090965 | A1* | 3/2020 | Miyashita | C23C 16/0209 |
| 2020/0102652 | A1* | 4/2020 | Nagata | C23C 16/4584 |
| 2020/0123659 | A1* | 4/2020 | Miyashita | C23C 16/4412 |
| 2020/0165722 | A1* | 5/2020 | Saido | H01L 21/67098 |
| 2020/0196390 | A1* | 6/2020 | Masunaga | H01L 21/67248 |
| 2020/0343114 | A1* | 10/2020 | Yamaguchi | H01L 21/67248 |
| 2020/0393197 | A1* | 12/2020 | Kosugi | H01L 21/67109 |
| 2020/0399757 | A1* | 12/2020 | Hara | C23C 16/45542 |
| 2020/0407845 | A1* | 12/2020 | Miyashita | B08B 9/00 |
| 2021/0181033 | A1* | 6/2021 | Akao | H01L 21/67248 |
| 2021/0183670 | A1* | 6/2021 | Hara | C23C 16/509 |
| 2022/0108900 | A1* | 4/2022 | Shimada | C23C 16/46 |
| 2022/0139737 | A1* | 5/2022 | Akao | G05D 23/1931 219/638 |

* cited by examiner

TEMPERATURE ADJUSTMENT APPARATUS FOR HIGH TEMPERATURE OVEN

CROSS REFERENCE TO RELATED APPLICATIONS

The present application is a divisional application of U.S. patent application Ser. No. 16/666,359 filed on Oct. 28, 2019, which claims the benefit of Taiwanese Patent Application Nos. 107144028 filed on Dec. 5, 2018 and 108119887 filed on Jun. 5, 2019. All the above are hereby incorporated by reference.

BACKGROUND OF THE INVENTION

1. Field of the Invention

The present invention relates to the technical field of electronic packaging, and more particularly to a temperature adjustment apparatus for a high temperature oven, which cools the gas flowing out of a processing chamber by a cooler in a gas reprocessing device, heats the gas in the gas reprocessing device by a heater, and returns the gas to the processing chamber by using a gas recovery device, thereby greatly improving the heating and cooling efficiency of the gas, achieving the purpose of gas recovery and reuse, and effectively reducing the production cost.

2. Description of the Related Art

In recent years, electronic technology changes with each passing day, and electronic products composed of integrated circuit components have become an indispensable tool in modern daily life. In the process of semiconductor packaging, the cooling processes and the heating processes often play an important role, and it is often necessary to switch between these cooling processes and heating processes. For example, for cooling from high temperature to low temperature, or cooling from high temperature to low temperature and then heating to high temperature, etc., the faster the cooling and/or heating rate is, the higher the process efficiency is. In the conventional cooling process, gas cooling is often performed directly in the processing chamber by using an air-cooled or water-cooled cooler. However, since the heat capacity of the cavity is too large, the effect of rapid cooling cannot be achieved. In addition, in the conventional heating process, gas heating is often performed directly in the processing chamber by using a heater. Similarly, since the heat capacity of the cavity is too large, the effect of rapid heating cannot be achieved. Therefore, in order to achieve the effects of rapid cooling and rapid heating, the conventional cooling process often uses the gas that directly discharges high temperature, and then a low-temperature gas is introduced to achieve the effect of rapid cooling. However, since it is necessary to evacuate the existing high temperature gas and then introduce new low temperature gas from the outside, the existing gas cannot be effectively utilized, resulting in waste of gas cost. In the above cases, if it is further desired to return the process temperature to the temperature level before the temperature drop (or even reach a higher temperature level than before the temperature drop), the low temperature gas must be evacuated and then new high temperature gas is introduced from the outside, which also causes waste of gas costs. Moreover, part of the process chemicals in the heating process may be diffused in the processing chamber due to volatilization or evaporation. When the cooling process is performed, the gaseous process chemicals floating in the processing chamber are condensed to form contaminants attached to the inner wall of the cavity, which causes increase in the machine maintenance cost and decrease in productivity. In addition, the oven used in the conventional semiconductor packaging process is heated in the form of heat convection. Such heating mode requires a set of fans to be disposed inside the oven cavity, so that the internally heated gas causes convection. For the rapid heating and the temperature uniformity during heating, it is necessary to consider the acceleration of the flow of the heated gas. The vibration of baking products caused by the disturbance of the gas causes an unpredictable risk to many semiconductor components, which needs to be improved.

Therefore, regarding the problems in the foregoing conventional semiconductor packaging due to process switching, how to develop a temperature adjustment apparatus which is more ideal and practical and takes economic benefits into consideration is actually the objective and direction for an active research and development breakthrough of related manufacturers.

In view of the above, the inventor obtains the present invention with practicability for the foregoing objective according to the manufacturing development and design experience of related products after detailed design and careful evaluation.

SUMMARY OF THE INVENTION

The technical problem to be solved: the conventional semiconductor packaging cannot achieve the effects of rapid cooling and rapid heating due to the large heat capacity of the cavity during the process switching. In order to improve the cooling and heating effects, in the cooling process, the high temperature gas is often directly discharged, and then the low temperature gas is introduced, which causes waste of gas cost; in the heating process, in order to make the temperature quickly reach the temperature level before the temperature drop, the low temperature gas must be evacuated, and then a new high temperature gas is introduced from the outside, which also causes waste of gas cost. In addition, the oven used in the conventional semiconductor packaging process is heated in the form of heat convection. For the rapid heating and the temperature uniformity during heating, it is necessary to consider the acceleration of the flow of the heated gas. The vibration of baking products caused by the disturbance of the gas causes an unpredictable risk to many semiconductor components, which needs to be improved.

Technical features to solve the problem: in order to improve the foregoing problems, a first embodiment of the present invention provides a temperature adjustment apparatus for a high temperature oven, comprising: an oven comprising an oven cavity, at least one intake manifold, at least one exhaust manifold, an inner casing cover, at least one heating element and a chamber door, wherein a processing chamber is formed inside the oven cavity; at least one of the intake manifolds is mounted on one side of the processing chamber, and at least one of the exhaust manifolds is mounted on the other side thereof; a plurality of intake holes is disposed at the periphery of at least one of the intake manifolds, and a plurality of exhaust holes is disposed at the periphery of at least one of the exhaust manifolds; the inner casing cover is disposed around an inner wall of the oven cavity; an annular accommodating space is formed inside the inner casing cover, and at least one of the heating elements is disposed in the accommodating space; the inner casing cover is heated by at least one of the heating elements, and then the processing chamber is heated by the inner casing cover in the form of thermal radiation; the chamber door is which is disposed at the bottom of the oven cavity and configured to be raised and lowered vertically; an inner surface of the chamber door is provided with a processing frame on which an object to be processed can be placed; and the object to be processed can be a semiconductor chip.

A gas reprocessing device in which a gas in the processing chamber flows, and the gas is processed by the gas reprocessing device. The gas reprocessing device comprises a cooler, a heater, and a gas recovery device. The gas in the gas reprocessing device is cooled by the cooler. The gas flowing back to the processing chamber via the gas reprocessing device is heated by the heater. The gas in the processing chamber is sucked into the gas reprocessing device by using the gas recovery device; the sucked gas can be directly discharged from the gas reprocessing device or reprocessed and flows back to the processing chamber, and the gas recovery device is a fan.

In the foregoing, at least one of the heating elements is a heating sleeve, a heating plate, a heating wire or a heating rod.

In the foregoing, the gas in at least one of the intake manifolds is ejected through each of the intake holes to disturb the gas in the processing chamber, and the gas in the processing chamber is discharged through at least one of the exhaust manifolds to form heat convection, which promotes temperature regulation inside the processing chamber and effectively improves the uniformity of gas temperature distribution.

A second embodiment of the present invention provides a temperature adjustment apparatus for a high temperature oven, comprising: an oven comprising an oven cavity, at least one intake manifold, at least one exhaust manifold, at least one heating element and a chamber door, wherein a processing chamber is formed inside the oven cavity; at least one of the intake manifolds is mounted on one side of the processing chamber, and at least one of the exhaust manifolds is mounted on the other side thereof; a plurality of intake holes is disposed at the periphery of at least one of the intake manifolds, and a plurality of exhaust holes is disposed at the periphery of at least one of the exhaust manifolds; at least one of the heating elements is disposed between an inner wall of the oven cavity and the side of at least one of the intake manifolds; the gas in at least one of the intake manifolds is ejected through each of the inlet holes, so that at least one of the heating elements heats the processing chamber in the form of heat convection; the chamber door is disposed at the bottom of the oven cavity and configured to be raised and lowered vertically; an inner surface of the chamber door is provided with a processing frame on which an object to be processed can be placed; and the object to be processed can be a semiconductor chip.

A gas reprocessing device in which the gas in the processing chamber flows, the gas being processed by the gas reprocessing device. The gas reprocessing device comprises a cooler, a heater, and a gas recovery device. The gas in the gas reprocessing device is cooled by the cooler. The gas flowing back to the processing chamber via the gas reprocessing device is heated by the heater. The gas in the processing chamber is sucked into the gas reprocessing device by using the gas recovery device, the sucked gas can be directly discharged from the gas reprocessing device or reprocessed and flows back to the processing chamber, and the gas recovery device is a fan.

In the foregoing, at least one of the heating elements is a heating sleeve, a heating plate, a heating wire or a heating rod.

In the foregoing, the temperature adjustment apparatus for a high temperature oven further comprises a gas delivery unit, wherein the gas delivery unit comprises a gas inlet line, a gas outlet line, a gas recovery line, and a gas discharge line; one end of the gas inlet line is connected to at least one of the intake manifolds, and the other end thereof is connected to a gas source or the gas recovery line; the gas source is an air compressor or a factory gas line; the gas source inputs a gas with a predetermined pressure into the processing chamber via the gas inlet line; one end of the gas outlet line is connected to at least one of the exhaust manifolds, and the other end thereof is connected to the gas reprocessing device; one end of the gas recovery line is connected to the gas inlet line or directly connected to at least one of the intake manifolds, and the other end thereof is connected to the gas reprocessing device; and one end of the gas discharge line is connected to the gas reprocessing device to discharge the gas in the gas reprocessing device to the outside.

In the foregoing, the intake holes are arranged at equal intervals.

In the foregoing, the exhaust holes are arranged at equal intervals.

In the foregoing, the chamber door is opened and closed in a pneumatic mode, a hydraulic mode or a motor driving mode.

In the foregoing, the gas reprocessing device further comprises at least one filter through which the gas flowing out of the processing chamber is filtered.

In the foregoing, the gas reprocessing device further comprises a catalytic converter through which the gas is processed during gas heating.

In the foregoing, when the process of the processing chamber demands high temperature, a heater and a catalyst converter are disposed in the gas recovery line to further heat and/or process the gas leaving the gas reprocessing device during the time of after the gas leaves the gas reprocessing device and before the gas returns to the processing chamber, so as to shorten the time for heating the gas in the processing chamber and/or further purifying the gas by using a catalytic reaction.

In the foregoing, the gas mixed with gaseous process chemicals flows into each of the exhaust holes, and flows out of the processing chamber via at least one of the exhaust manifolds.

In the foregoing, the processing frame is synchronously moved out of the processing chamber when the chamber door is open, so as to easily place and take out an object, and the processing frame is synchronously moved into the processing chamber when the chamber door is closed, thereby effectively saving manpower cost.

Compared with the effect of the prior art, the temperature adjustment apparatus for a high temperature oven of the present invention heats the gas flowing back to the processing chamber through the gas reprocessing device by the heater, thereby shortening the time for heating the gas in the processing chamber and effectively increasing the gas heating efficiency. The gas in the processing chamber is sucked into the gas reprocessing device by using a gas recovery device, and the sucked gas is reprocessed and then flows back to the processing chamber for gas recovery and reuse, thereby effectively reducing the production cost. The gas mixed with the gaseous process chemicals in the processing chamber flows into the gas reprocessing device through the gas outlet line after the process is completed, and the process chemical pollutants in the gas are filtered through at least one filter to avoid the processing chamber being contaminated during gas recovery and reuse. The gas in the processing chamber flows into the gas reprocessing device, and the gas is cooled by the cooler. Compared to the gas cooling directly in the processing chamber at a higher temperature, and there is no influence of large heat capacity of the oven cavity, the cooling efficiency of the gas can be effectively improved. The gas is ejected through each of the intake holes to disturb the gas in the processing chamber, so as to form heat convection, thereby promoting temperature regulation inside the process chamber and effectively enhancing the uniformity of the gas temperature distribution.

The techniques, means and effects of the present invention will be described in detail with reference to preferred embodiments and the accompanying drawings, and therefore, the foregoing objective, construction and features of the present invention will be understood.

DETAILED DESCRIPTION OF THE PREFERRED EMBODIMENTS

Figure 1:
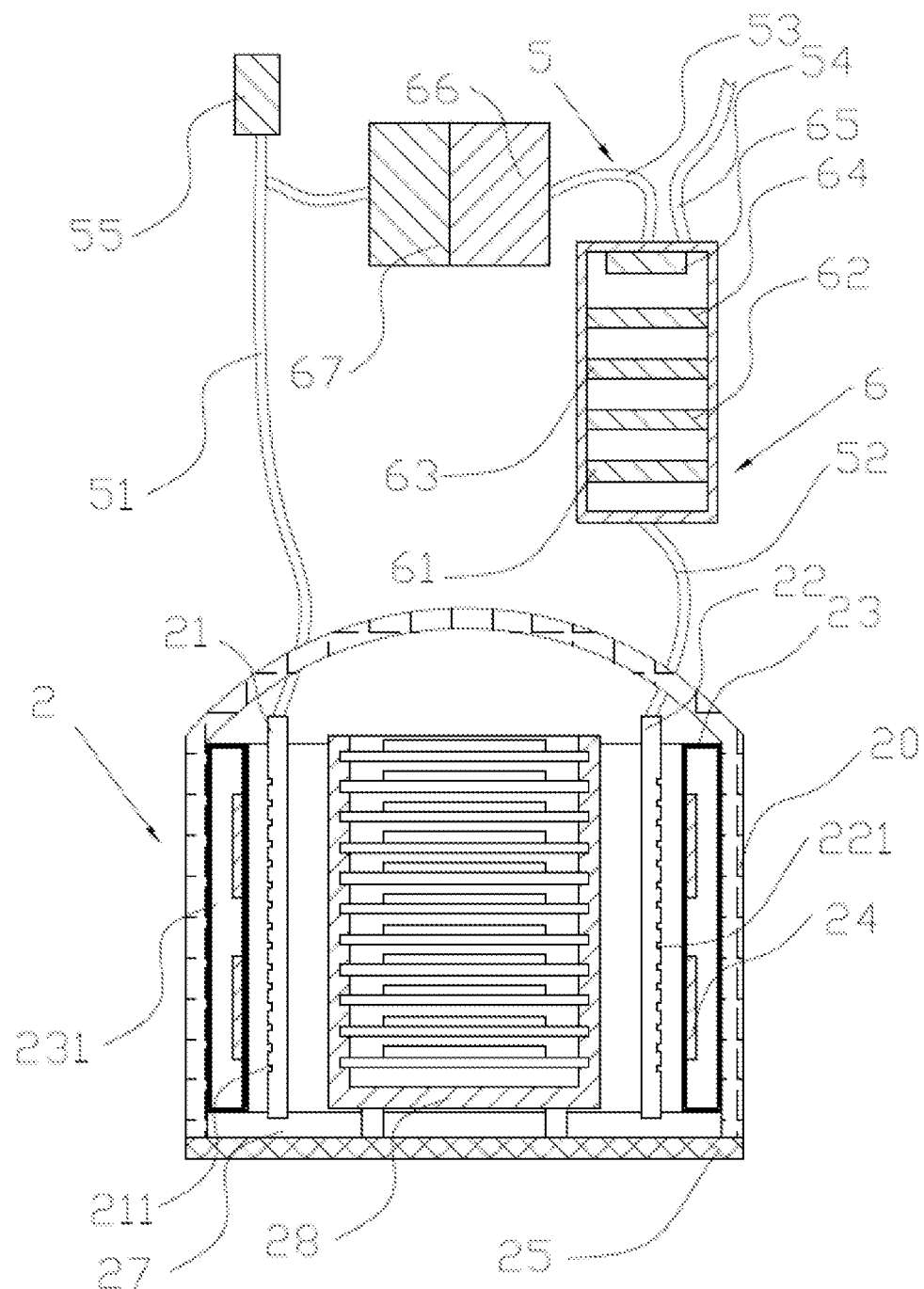
FIG. 1 is a schematic diagram showing a temperature adjustment apparatus for a high temperature oven according to a first embodiment of the present invention.
Figure 2:
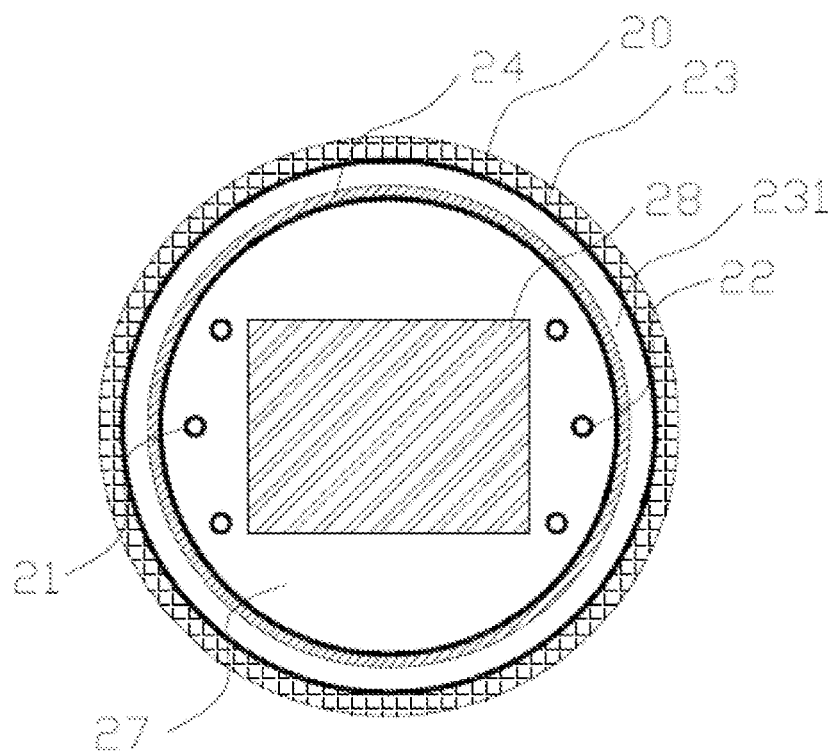
FIG. 2 is a schematic diagram showing the configuration of the oven according to the first embodiment of the present invention.

Referring to FIGS. 1 and 2, the first embodiment of the present invention provides a temperature adjustment apparatus for a high temperature oven, comprising: an oven 2. The oven 2 comprises an oven cavity 20, at least one intake manifold 21, at least one exhaust manifold 22, an inner casing cover 23, at least one heating element 24, and a chamber door 25. A processing chamber 27 is formed inside the oven cavity 20. At least one of the intake manifolds 21 is mounted on one side of the processing chamber 27, and at least one of the exhaust manifolds 22 is mounted on the other side thereof. A plurality of intake holes 211 is disposed at the periphery of at least one of the intake manifolds 21, and the intake holes 211 are arranged at equal intervals. A plurality of exhaust holes 221 is disposed at the periphery of at least one of the exhaust manifolds 22, and the exhaust holes 221 are arranged at equal intervals. The inner casing cover 23 is disposed around an inner wall of the oven cavity 20, and an annular accommodating space 231 is formed inside the inner casing cover 23. At least one heating element 24 is disposed in the accommodating space 231. At least one of the heating elements 24 is a heating sleeve, a heating plate, a heating wire or a heating rod. The inner casing cover 23 is heated by at least one of the heating elements 24, and the processing chamber 27 is heated by the inner casing cover 23 in the form of heat radiation, so that the processing chamber 27 is in a high-temperature and high-pressure working environment. The working temperature in the processing chamber 27 ranges from 20 degrees Celsius (room temperature) to 1500 degrees Celsius, and the working pressure ranges from 1 atmosphere (atm) to 100 atmosphere (atm). The gas in at least one of the intake manifolds 21 is ejected through each of the intake holes 211 to disturb the gas in the processing chamber 27, and the gas in the processing chamber 27 is discharged through at least one of the exhaust manifolds 22 to form heat convection, and thus the temperature regulation inside the processing chamber 27 is promoted, and the uniformity of the gas temperature distribution is effectively improved. The chamber door 25 is disposed at the bottom of the oven cavity 20 and configured to be raised and lowered vertically. The chamber door 25 is opened and closed in a pneumatic mode, a hydraulic mode or a motor-driven mode. An inner surface of the chamber door 25 is provided with a processing frame 28 on which an object to be processed can be placed. The object to be processed can be a semiconductor chip.

A gas delivery unit 5 comprises a gas inlet line 51, a gas outlet line 52, a gas recovery line 53, and a gas discharge line 54. One end of the gas inlet line 51 is connected to at least one of the intake manifolds 21, and the other end thereof is connected to a gas source 55 or the gas recovery line 53. The gas source 55 is an air compressor or a factory gas line, and the gas source 55 inputs the gas with a predetermined pressure to the processing chamber 27 via the gas inlet line 51. One end of the gas outlet line 52 is connected to at least one of the exhaust manifolds 22. One end of the gas recovery line 53 is connected to the gas inlet line 51, or is directly connected to at least one of the intake manifolds 21.

A gas reprocessing device 6 comprises a cooler 61, at least one filter 62, a heater 63, a catalytic converter 64, and a gas recovery device 65. The other end of the gas outlet line 52 is connected to the gas reprocessing device 6. The gas in the processing chamber 27 flows into the gas reprocessing device 6 via the gas outlet line 52. The gas is cooled by the cooler 61. The gas flowing out of the processing chamber 27 is filtered by at least one of the filters 62. The gas flowing back to the processing chamber 27 via the gas reprocessing device 6 is heated by the heater 63, and the gas is processed by the catalytic converter 64 during the gas heating. For example, the gas is purified by the catalytic converter 64 through a catalytic reaction (for example, a component such as CO, HC, and NOx in the gas is converted into a gas harmless to the human body such as $CO_2$, $H_2O$, $N_2$, and $O_2$). The catalytic converter 64 may, for example, contain a metal such as rhodium, platinum, and palladium as a catalyst. The catalytic converter 64 can be a binary catalytic converter, a ternary catalytic converter, or a combination of the binary catalytic converter and the ternary catalytic converter. The other end of the gas recovery line 53 is connected to the gas reprocessing device 6. The gas in the processing chamber 27 is sucked into the gas reprocessing device 6 by the gas recovery device 65, and the sucked gas can be directly discharged from the gas reprocessing device 6 or reprocessed and flows back to the processing chamber 27. The gas recovery device 65 is a fan.

Figure 3:
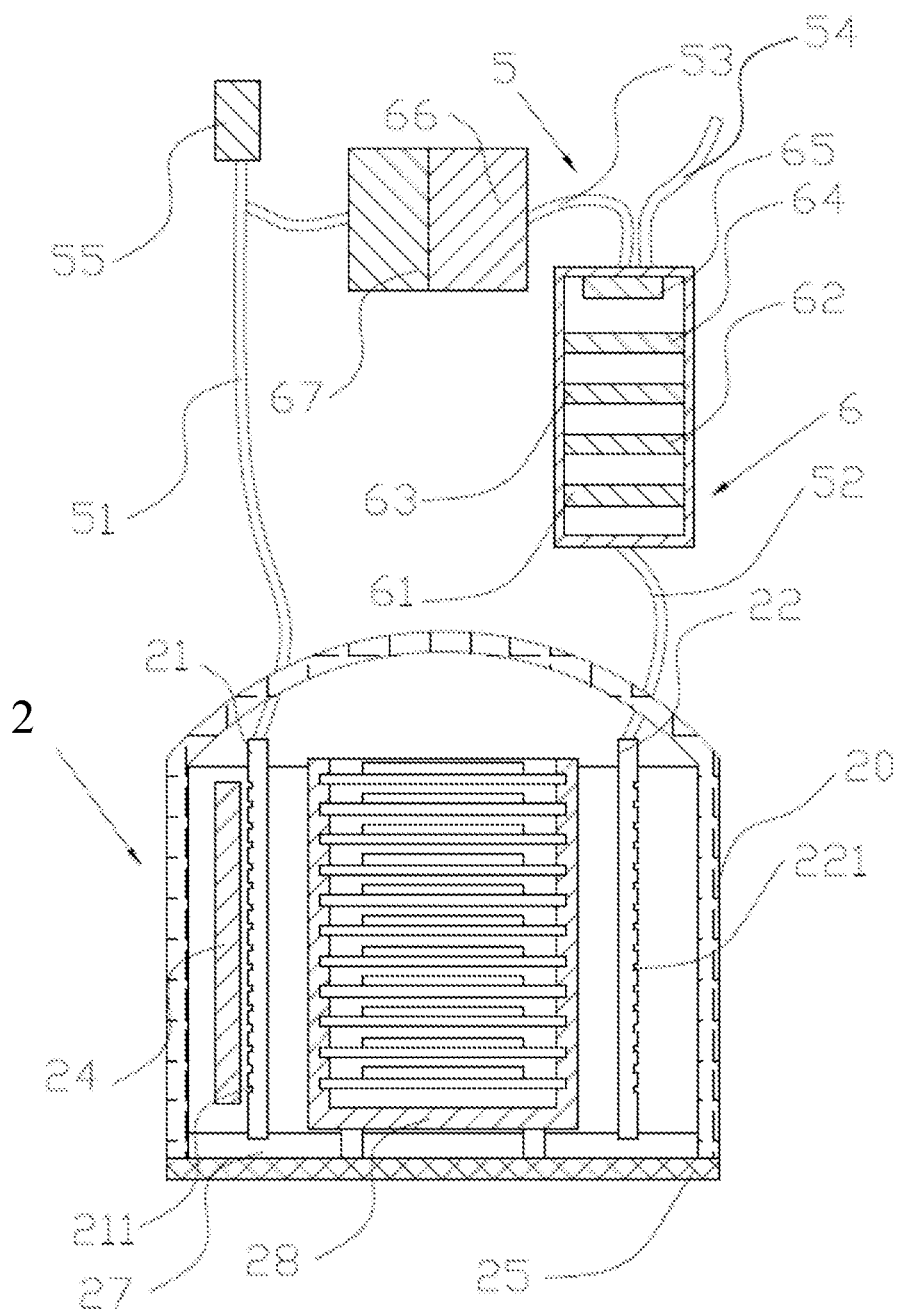
FIG. 3 is a schematic diagram showing a temperature adjustment apparatus for a high temperature oven according to a second embodiment of the present invention.
Figure 4:
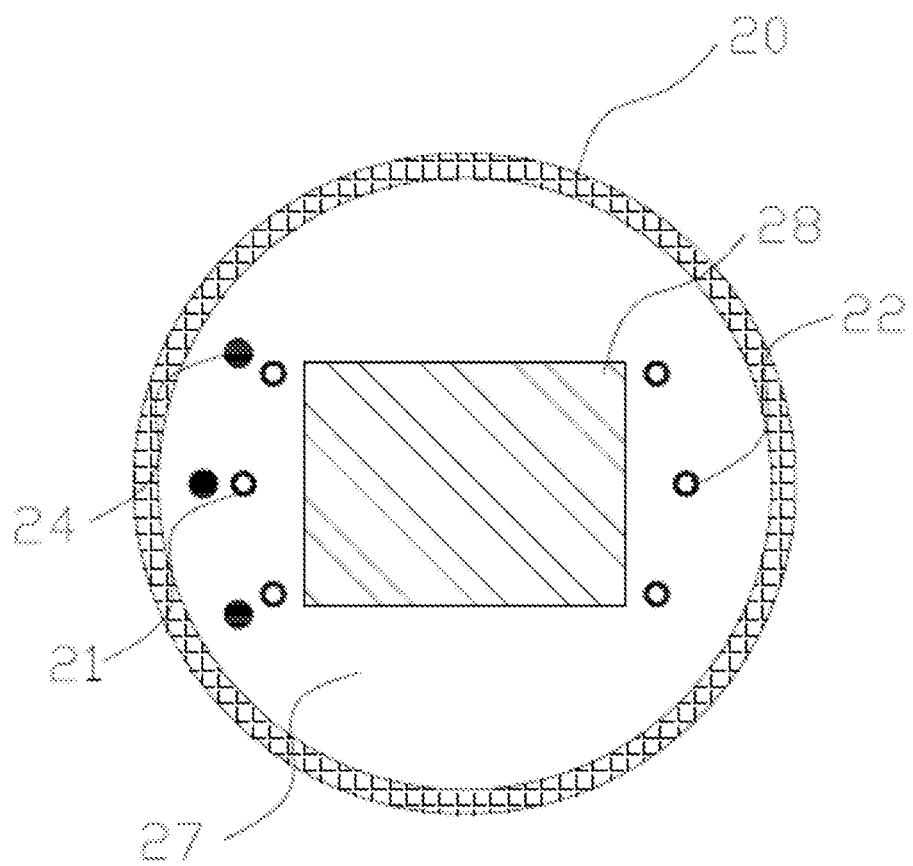
FIG. 4 is a schematic diagram showing the configuration of the oven according to the second embodiment of the present invention.

Referring to FIGS. 3 and 4 (the same elements as the first embodiment use the same reference numerals), the second embodiment of the present invention provides a temperature adjustment apparatus for a high temperature oven, comprising: an oven 2. The oven 2 comprises an oven cavity 20, at least one intake manifold 21, at least one exhaust manifold 22, at least one heating element 24, and a chamber door 25. A processing chamber 27 is formed inside the oven cavity 20. At least one of the intake manifolds 21 is mounted on one side of the processing chamber 27, and at least one of the exhaust manifolds 22 is mounted on the other side thereof. A plurality of intake holes 211 is disposed at the periphery of at least one of the intake manifolds 21, and the intake holes 211 are arranged at equal intervals. A plurality of exhaust holes 221 is disposed at the periphery of at least one of the exhaust manifolds 22, and the exhaust holes 221 are arranged at equal intervals. At least one heating element 24 is disposed between an inner wall of the oven cavity 20 and the side of at least one of the intake manifolds 21. The gas in at least one of the intake manifolds 21 is ejected through each of the intake holes 211. The processing chamber 27 is heated by at least one of the heating elements 24 in the form of heat convection, so that the processing chamber 27 is in a high-temperature and high-pressure working environment. The working temperature in the processing chamber 27 ranges from 20 degrees Celsius (room temperature) to 1500 degrees Celsius, and the working pressure ranges from 1 atmosphere (atm) to 100 atmosphere (atm). The chamber door 25 is disposed at the bottom of the oven cavity 20 and configured to be raised and lowered vertically. The chamber door 25 is opened and closed in a pneumatic, mode, a hydraulic mode, or a motor-driven mode. An inner surface of the chamber door 25 is provided with a processing frame 28 on which an object to be processed can be placed. The object to be processed can be a semiconductor chip.

A gas delivery unit 5 comprises a gas inlet line 51, a gas outlet line 52, a gas recovery line 53, and a gas discharge line 54. One end of the gas inlet line 51 is connected to at least one of the intake manifolds 21, and the other end thereof is connected to a gas source 55 or the gas recovery line 53. The gas source 55 is an air compressor or a factory gas line, and the gas source 55 inputs the gas with a predetermined pressure to the processing chamber 27 via the gas inlet line 51. One end of the gas outlet line 52 is connected to at least one of the exhaust manifolds 22. One end of the gas recovery line 53 is connected to the gas inlet line 51, or is directly connected to at least one of the intake manifolds 21.

A gas reprocessing device 6 comprises a cooler 61, at least one filter 62, a heater 63, a catalytic converter 64, and a gas recovery device 65. The other end of the gas outlet line 52 is connected to the gas reprocessing device 6. The gas in the processing chamber 27 flows into the gas reprocessing device 6 via the gas outlet line 52. The gas is cooled by the cooler 61. The gas flowing out of the processing chamber 27 is filtered by at least one of the filters 62. The gas flowing back to the processing chamber 27 via the gas reprocessing device 6 is heated by the heater 63, and the gas is processed by the catalytic converter 64 during the gas heating. The other end of the gas recovery line 53 is connected to the gas reprocessing device 6. The gas in the processing chamber 27 is sucked into the gas reprocessing device 6 by the gas recovery device 65, and the sucked gas can be directly discharged from the gas reprocessing device 6 or reprocessed and flows back to the processing chamber 27. The gas recovery device 65 is a fan.

In the foregoing, one end of the gas discharge line 54 is connected to the gas reprocessing device 6 to discharge the gas in the gas reprocessing device 6 to the outside.

In the foregoing, when the process of the processing chamber 27 demands high temperature, a heater 66 and a catalyst converter 67 are disposed in the gas recovery line 53 to further heat and/or process the gas leaving the gas reprocessing device 6 during the time of after the gas leaves the gas reprocessing device 6 and before the gas returns to the processing chamber 27, so as to shorten the time for heating the gas in the processing chamber 27 and/or further purifying the gas by using the catalytic reaction.

In the foregoing, the gas mixed with gaseous process chemicals flows into each of the exhaust holes 221, and flows out of the processing chamber 27 via at least one of the exhaust manifolds 22.

In the foregoing, the processing frame 28 is synchronously moved out of the processing chamber 27 when the chamber door 25 is open, so as to easily place and take out an object, and the processing frame 28 is synchronously moved into the processing chamber 27 when the chamber door 25 is closed, thereby effectively saving manpower cost.

According to the temperature adjustment apparatus for a high temperature oven of the present invention, the gas flowing back to the processing chamber 27 via the gas reprocessing device 6 is heated by the heater 63, thereby shortening the time for heating the gas in the processing chamber 27 and effectively improving the heating efficiency of the gas.

According to the temperature adjustment apparatus for a high temperature oven of the present invention, the gas in the processing chamber 27 is sucked into the gas reprocessing device 6 by using the gas recovery device 65, and the sucked gas is reprocessed and then flows back to the processing chamber 27, to achieve the purpose of gas recovery and reuse, thereby effectively reducing the production cost.

According to the temperature adjustment apparatus for a high temperature oven of the present invention, the gas mixed with gaseous process chemicals in the processing chamber 27 flows into the gas reprocessing device 6 through the gas outlet line 52 after the process is completed, and the process chemical pollutants in the gas are filtered through at least one of the filters 62 to avoid the processing chamber 27 being contaminated during gas recovery and reuse.

According to the temperature adjustment apparatus for a high temperature oven of the present invention, the gas in the processing chamber 27 flows into the gas reprocessing device 6 via the gas outlet line 52, and the gas is cooled by the cooler 61. Compared to the gas cooling directly in the processing chamber 27 at a higher temperature, and there is no influence of large heat capacity of the oven cavity 20, the cooling efficiency of the gas can be effectively improved.

According to the temperature adjustment apparatus for a high temperature oven of the present invention, the gas is ejected through each of the intake holes 211 to disturb the gas in the processing chamber 27, so as to form heat convection, thereby promoting temperature regulation inside the process chamber 27 and effectively enhancing the uniformity of the gas temperature distribution.

The temperature adjustment apparatus for a high temperature oven of the present invention provides a heat radiation heating mode to solve the problem of the conventional oven. However, since the heat generated by the heat radiation is inversely proportional to the biquadrate of the distance to the heat source, an uneven heating problem exists. Therefore, the present invention further introduces a solution of high-pressure gas supplemented with a small amount of heat convection as described above.

The foregoing is specific description of the technical features of the present invention for the preferred embodiments of the present invention. However, changes and modifications can be made to the present invention by those skilled in the art without departing from the spirit and principle of the present invention. Moreover, the changes and modifications fall within the scope defined by the appended claims.

What is claimed is:

1. A temperature adjustment apparatus for a high temperature oven, comprising:
   an oven comprising an oven cavity, at least one intake manifold, at least one exhaust manifold, and at least one heating element, wherein a processing chamber is formed inside the oven cavity; at least one of the intake manifolds is mounted on one side of the processing chamber, and at least one of the exhaust manifolds is mounted on the other side thereof; a plurality of intake holes is disposed at the periphery of at least one of the intake manifolds, and a plurality of exhaust holes is disposed at the periphery of at least one of the exhaust manifolds; at least one of the heating elements is disposed between an inner wall of the oven cavity and the side of at least one of the intake manifolds; the gas in at least one of the intake manifolds is ejected through each of the inlet holes, so that at least one of the heating elements heats the processing chamber in the form of heat convection;
   a gas reprocessing device in which the gas in the processing chamber flows, the gas being processed by the gas reprocessing device; and
   a heater to heat the gas leaving the gas reprocessing device, disposed in a section after the gas leaves the gas reprocessing device and before the gas returns to the processing chamber, and during the heating of the gas in the heater, the gas leaving the gas reprocessing device is processed by using a catalyst converter, and the gas is purified by using a catalytic reaction.

2. The temperature adjustment apparatus for a high temperature oven according to claim 1, further comprising a gas delivery unit, wherein the gas delivery unit comprises a gas inlet line, a gas outlet line, and a gas recovery line; one end of the gas inlet line is connected to at least one of the intake manifolds, and the other end thereof is connected to a gas source or the gas recovery line; the gas source inputs a gas of a predetermined pressure into the processing chamber via the gas inlet line; one end of the gas outlet line is connected to at least one of the exhaust manifolds, and the other end thereof is connected to the gas reprocessing device; and one end of the gas recovery line is connected to the gas inlet line or directly connected to at least one of the intake manifolds, and the other end thereof is connected to the gas reprocessing device.

3. The temperature adjustment apparatus for a high temperature oven according to claim 2, wherein the gas delivery unit further comprises a gas discharge line; and one end of the gas discharge line is connected to the gas reprocessing device to discharge the gas in the gas reprocessing device to the outside.

4. The temperature adjustment apparatus for a high temperature oven according to claim 1, wherein the oven further comprises a chamber door disposed at the bottom of the oven cavity and configured to be raised and lowered vertically.

5. The temperature adjustment apparatus for a high temperature oven according to claim 4, wherein the chamber door is opened and closed in a pneumatic mode, a hydraulic mode or a motor driving mode.

6. The temperature adjustment apparatus for a high temperature oven according to claim 4, wherein a processing frame is disposed on an inner surface of the chamber door; the processing frame is synchronously moved out of the processing chamber when the chamber door is open, and the processing frame is synchronously moved into the processing chamber when the chamber door is closed.

7. The temperature adjustment apparatus for a high temperature oven according to claim 1, wherein the gas reprocessing device comprises a cooler through which the gas in the gas reprocessing device is cooled.

8. The temperature adjustment apparatus for a high temperature oven according to claim 1, wherein the gas reprocessing device further comprises at least one filter through which the gas flowing out of the processing chamber is filtered.

9. The temperature adjustment apparatus for a high temperature oven according to claim 1, wherein the gas reprocessing device further comprises a gas recovery device through which the gas in the processing chamber is sucked into the gas reprocessing device, and the sucked gas can be directly discharged from the gas reprocessing device or reprocessed and flows back to the processing chamber.

* * * * *